US006206970B1

(12) United States Patent
Atwell

(10) Patent No.: US 6,206,970 B1
(45) Date of Patent: *Mar. 27, 2001

(54) SEMICONDUCTOR WAFER PROCESSOR, SEMICONDUCTOR PROCESSOR GAS FILTERING SYSTEM AND SEMICONDUCTOR PROCESSING METHODS

(75) Inventor: David R. Atwell, Boise, ID (US)

(73) Assignee: Micron Technology, Inc., Boise, ID (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/922,948

(22) Filed: Sep. 3, 1997

(51) Int. Cl.[7] ................................................. C23C 16/00
(52) U.S. Cl. ...................... 118/715; 96/15; 96/62; 118/719; 118/722; 118/723 E; 134/1; 134/1.3; 134/21; 134/34; 134/37; 156/345; 156/643.1; 156/646
(58) Field of Search ...................... 118/715, 719, 118/723 E, 722; 156/643.1, 345, 646; 134/1, 1.3, 21, 34, 37; 96/15, 62

(56) References Cited

U.S. PATENT DOCUMENTS

| 4,768,291 | * | 9/1988 | Palmer | 34/22 |
| 5,025,570 | * | 6/1991 | Moffat | 432/152 |
| 5,224,809 | * | 7/1993 | Maydan | 118/719 |
| 5,542,441 | | 8/1996 | Mohindra et al. | 134/95.2 |

FOREIGN PATENT DOCUMENTS 8-61853 * 3/1996 (JP) .

OTHER PUBLICATIONS

*Some of the Things You Don't See Every Day*, ©Honeywell 1993.

"I'm concerned about the environment inside too" re Honeywell F90 Air Cleaner, brochure by Honeywell.

Catalog, ©Honeywell, Inc. 1995.

* cited by examiner

*Primary Examiner*—Nasser Ahmad
(74) *Attorney, Agent, or Firm*—Wells, St. John, Roberts, Gregory & Matkin, P.S.

(57) ABSTRACT

Particle traps for semiconductor wafer vapor processors and methods of filtering particles in a semiconductor wafer processor are described. In accordance with a preferred implementation, a semiconductor wafer processor includes a processing chamber for containing a gas during processing of a semiconductor wafer. A particle trap is positioned within the reaction chamber and is operative for removing particles within the processing chamber. In one version, the particle trap is an electrostatic precipitator charged for removing particles from the gas. In accordance with another implementation, a semiconductor wafer vapor processor includes a processing chamber for containing a gas during processing of a semiconductor wafer. A wafer holder is provided within the processing chamber. A particle trap comprising at least two chargeable elements is positioned within the processing chamber and is spaced from the wafer holder. In one version, the processing chamber is a reaction chamber. In another version, the processing chamber is a vacuum chamber. In accordance with yet another aspect, a method of filtering particles in a semiconductor wafer processor includes: causing processing gases to flow through a processing chamber of a semiconductor wafer processor; filtering particles from within a processing reactor of the processing chamber.

75 Claims, 5 Drawing Sheets

SEMICONDUCTOR WAFER PROCESSOR, SEMICONDUCTOR PROCESSOR GAS FILTERING SYSTEM AND SEMICONDUCTOR PROCESSING METHODS

TECHNICAL FIELD

This invention relates to particulate contamination in semiconductor wafer processing chambers and methods of filtering particles in a semiconductor wafer processor.

BACKGROUND OF THE INVENTION

Semiconductor processing often involves the deposition of films or layers over or on a semiconductor substrate surface which may or may not have other layers formed thereon. For example, during integrated circuit fabrication, thin films of dielectrics, polysilicon, and metal conductors are deposited on the wafer surface to form devices and circuits. Exemplary techniques used for forming these thin films are physical vapor deposition (PVD), chemical vapor deposition (CVD), and epitaxy (a special case of CVD). As an example, CVD involves a chemical reaction of vapor phase chemicals and reactants that contain the desired constituents to be deposited on the substrate or substrate surface. Reactant gases are introduced into a reaction chamber or a reactor and are decomposed and reacted at a heated surface to form the desired film or layer.

Semiconductor processing is typically carried out under a controlled environment, with particulars of the environment depending on the process being implemented. For example, there are three major CVD processes which exist and which may be utilized to form the desired films or layers on a substrate surface. These are: atmospheric pressure CVD (APCVD), low pressure CVD (LPCVD), and plasma enhanced CVD (PECVD). The former two processes (APCVD and LPCVD) are characterized by the pressure regimes and typically use thermal energy as the energy input to effect desired chemical reactions. The latter process (PECVD) is characterized by its pressure regime and the method of energy input.

Irrespective of the semiconductor process being used, it is further desirable to reduce the amount of particles and airborne contaminants present within a semiconductor processing chamber in order to realize a clean environment. Such a clean environment minimizes device defects, increases yields, and decreases the overall costs when fabricating integrated circuits. For the case of CVD systems, reaction chambers formed from quartz or stainless steel contain wafer holders formed from graphite, quartz or stainless steel. The substrate, or wafer holder, in one construction is directly heated by induction irradiation, with the reaction chamber walls remaining cold. Such a system is often described as a cold wall system. As such, the reaction takes place right at the wafer surface and is usually cleaner because the film does not build up on the chamber walls. With one such cold wall deposition system, precursors are used that are volatile enough to supply a sufficient amount of vaporized precursor to the process chamber. In this case, the gas lines and chamber walls do not need to be heated. However, particle contamination still remains a problem.

Alternatively, there exists a hot wall deposition system wherein the reaction takes place in the gas stream and the reaction product is deposited on surfaces of the system, including the reaction chamber walls. With one such hot wall deposition system, the reaction takes place at, or above, the wafer surface. Some precursors that are used are not very volatile and must be heated to supply enough vaporized precursor to the process chamber. Since the vaporized precursor will condense on any unheated surface, gas lines and chamber walls must be heated. The temperature where the reaction occurs is higher than the gas lines and chamber walls, but there are still unwanted deposits on the chamber walls, wafer holder and shower head. Such unwanted depositions can build up and flake off from the surfaces over time. Unless the reaction chamber is properly cleaned and maintained, the surfaces become a source of contamination during processing. A particular concern occurs when implementing wafer processing within a vacuum, or sub-pressurized atmosphere, wherein wafers are transferred into and out of the wafer processing chamber such that rapid pressure changes occur each time the transfer chamber is opened and closed. Such pressure changes can further result in dislodgement of deposits which have built up on inner wall surfaces of the reaction chamber, as well as on the semiconductor processing chamber.

Furthermore, other types of semiconductor wafer processors such as diffusion and oxidation furnaces must also maintain a clean internal environment. Irrespective of the source of particle contamination, whether from contaminants found in processing gases or from deposition and subsequent dislodgement of reaction product on inner surfaces of the system, there is also a need to minimize contamination so as to provide for low contamination levels and a clean environment when implementing any form of semiconductor wafer processing.

This invention grew out of concerns associated with improving the containment of particulate contaminants within semiconductor wafer processors and methods. This invention also grew out of concerns associated with improving the advantages and characteristics associated with reaction chambers of semiconductor wafer processors, including those advantages and characteristics mentioned above.

SUMMARY OF THE INVENTION

Semiconductor wafer processors and methods of filtering particles in a semiconductor wafer processor are described. In accordance with a preferred implementation, a semiconductor wafer vapor processor includes a processing chamber for containing a gas during processing of a semiconductor wafer. A particle trap is positioned within the reaction chamber and is operative for removing particles from within the processing chamber. In one version, the particle trap includes a charged structural component provided in a fluid flow path within the reaction chamber, such that the charged structural component is operable to attract undesired particles from within the reaction chamber. In accordance with one aspect, the gas forms a fluid flow path through the reaction chamber, and the filter includes a particle trap placed in a downstream portion of the reaction chamber. In accordance with another aspect, the filter includes an electrostatic precipitator charged for removing particles from the gas.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8). A first embodiment of the present invention is described with reference to FIGS. 1–2. In describing alternative embodiments, like numerals of components from preceding embodiments are utilized where appropriate, with slight differences being indicated by incrementing the number by 100. For example, charged structure 72 is first referred to in the embodiment of FIG. 3, and is referred to as charged structure 172 and charged structure 272 in FIG. 5.

Figure 1:
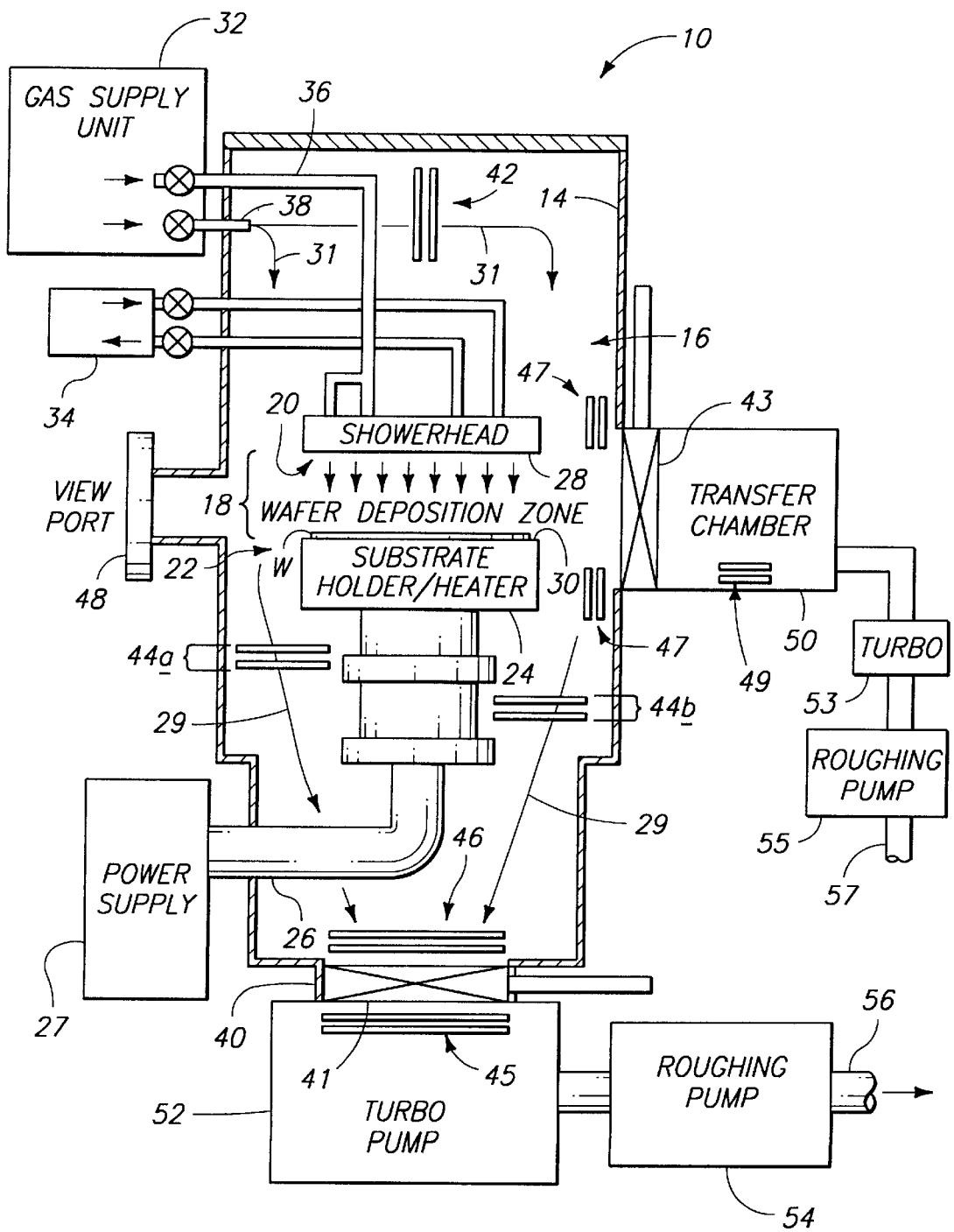
FIG. 1 is a block diagram of a plasma-enhanced chemical vapor deposition (PECVD) reactor system in accordance with preferred embodiments of the present invention.

Referring to FIG. 1, a semiconductor wafer vapor processor 10 is illustrated. As will be recognized by persons of ordinary skill in the art, the construction of semiconductor wafer processor 10 of FIG. 1 may be formed by a number of different configurations. For example, the semiconductor wafer processor can be a semiconductor wafer vapor processor, a semiconductor wafer vapor deposition reaction, a wafer processing furnace, a vacuum chamber for processing wafers or a precursor chamber. Semiconductor wafer vapor processor 10 comprises an inner surface defining a processing chamber 16 for containing a gas during processing of a semiconductor wafer W. According to one construction, the processing chamber has at least one internal wall, wherein the wall forms interior surface 14. According to one construction, the processing chamber comprises a reaction chamber. Semiconductor wafer vapor processor 10 also comprises a particle trap positioned within the processing chamber and operative for removing particles from the gas within the processing chamber. According to one construction, the particle trap comprises a filter.

In one embodiment, the semiconductor wafer vapor processor 10 comprises a semiconductor wafer vapor deposition reactor. In this case, processing chamber 16 comprises a reaction chamber. A wafer deposition zone 18 is provided within the reaction chamber and is defined between a gas emitter 20 and a wafer holder 24. Gas emitter 20, constructed in one form as a shower head, is provided within the reaction chamber proximate the wafer holder 24. Gas emitter 20 comprises a first electrode which is positioned along wafer deposition zone 18 in association with a second electrode, in one form a susceptor. The semiconductor wafer vapor deposition reactor further comprises at least one particle trap 42, 44a, 44b, 46, and 47, in one form a particle filter, positioned within the reaction chamber external of the wafer deposition zone. Additional particle traps 45 and 49 are provided within turbo pump 52 and transfer chamber 50, respectively. In one version, wafer holder 24 comprises a base holder/heater assembly on which one or more wafers W is received in association with wafer deposition zone 18.

Wafer holder 24 may receive power via a feed pipe 26 from an external power supply 27. A first electrode surface area 28 is formed by gas emitter 20, when configured as a first electrode. Similarly, a second electrode surface area 30 is formed by susceptor 22 when configured as a second electrode.

A fluid flow path 29, 31 may be formed within semiconductor wafer vapor processor 10, when configured as a wafer vapor deposition reactor. More particularly, a gas supply unit 32 introduces gases within processing chamber 16 by way of a precursor gas inlet line 36 and a process gas inlet line 38. Each of gas inlet lines 36 and 38 extend to the processing chamber, with a gas outlet line 40 extending from the processing chamber. Fluid flow paths 29 and 31 are provided within the processing chamber 16, extending between the gas inlet lines 36 and 38 and the gas outlet line 40, respectively.

According to the construction of FIG. 1, gas emitter 20 receives a closed-loop flow of cooling fluid from a coolant supply unit 34. Coolant supply unit 34 enables controlled management of temperatures at the shower head during wafer processing steps.

Each particle trap 42, 44a, 44b, 46, and 47 comprises a chargeable component provided in one of fluid flow paths 29 and 31 within processing chamber 16. Particle traps 45 and 49 comprise similar chargeable components provided within turbo pump 52 and transfer chamber 50, respectively. Each of turbo pump 52 and transfer chamber 50 is provided in fluid communication with processing chamber 16 when associated turbo control gate valve 41 and transfer chamber isolation valve 43, respectively, are opened. The chargeable component is operative to attract undesired particles from within processing chamber 16. In one implementation, the particle trap comprises a particle filter having at least two chargeable elements positioned within processing chamber 16 and spaced from wafer holder 24. Particle traps 44a, 44b and 46 are placed in a downstream portion of processing chamber 16 as defined by gas which forms fluid flow paths 29 and 31 extending through processing chamber 16.

Particle trap 47 comprises a chargeable component positioned proximate the entrance to transfer chamber 50 and adjacent an opening between processing chamber 16 and transfer chamber 50 provided by way of valve 43. In one construction, particle trap 47 comprises a unitary charging structure encircling the entrance to transfer chamber 50. In another construction, particle trap 47 comprises a plurality of individual particle traps positioned about the entrance to transfer chamber 50. In this manner, particle trap 47 is positioned to enable transfer of wafers between transfer chamber 50 and wafer deposition zone 18, typically via a robotic arm. Particle trap 49 is also provided within transfer chamber 50 and is operative to attract undesired particles from within transfer chamber 50 which can be introduced when inserting and removing wafers from transfer chamber 50. Isolation valve 43 is used to seal transfer chamber 50 from processing chamber 16 when inserting and removing wafers therefrom. Subsequently, particle trap 49 is operative to attract undesired particles from within transfer chamber 50, prior to opening valve 43.

Particle trap 45 comprises a chargeable component provided within turbo pump 52. The chargeable component is operative to attract undesired particles from within turbo pump 52. Turbo control gate valve 41 is operative to isolate turbo pump 52 from processing chamber 16. Particle trap 45 is operative to attract undesired particles, when valve 41 is opened or closed.

Particle traps 42, 44a, 44b, 45, 46, 47, and 49 each comprise chargeable elements in the form of a charge plate supported in spaced and electrically isolated relation from a wall, or interior surface 14, of the reaction chamber, or processing chamber 16. In the preferred implementation, each of particle traps 44a, 44b, 45, and 46 comprise an electrostatic precipitator provided downstream of wafer deposition zone 18.

Particle trap 46 is positioned within processing chamber 16 spaced down from wafer holder 24 and is provided in closer proximity with gas outlet line 40 than with wafer deposition zone 18. As such, particle trap 46 is provided downstream of wafer deposition zone 18.

Particle traps, in accordance with one aspect of the invention, can comprise a particle filter in the form of an electrostatic precipitator. The electrostatic precipitator can comprise an ionizer supported for fluid communication with any gas contained within the reaction or processing chamber, and is configured to charge particles present within the gas. The ionizer can comprise an electrified wire configured to generate an electric field for charging particles present within the gas. The particle traps can comprise at least one selectively chargeable particulate filter plate received within the reaction chamber. The filter plate can be mounted to at least one of the interior surfaces of the internal chamber walls through an insulator, such as insulator 88, as discussed below with reference to the embodiment of FIG. 4. The insulators, or electrically insulating material, electrically isolate the plates from the walls of interior surface 14.

Particle traps 42, 44a, 44b, 45, 46, 47, and 49 as shown in FIG. 1 each comprise two chargeable elements supported in adjacent, spaced apart relation within processing chamber 16. A first chargeable element of each particle trap imparts a first charge to particulate within the processing chamber 16. A second chargeable element imparts a second, opposite charge to attract and collect the charged particulate.

Further according to FIG. 1, a view port 48 is provided for observing wafer vapor deposition reaction processes occurring within wafer deposition zone 18. Transfer chamber 50 is also provided for enabling insertion and removal of wafers W from within wafer deposition zone 18. A turbomolecular pump 52 and a roughing pump 54 cooperate to reduce the gas density, and thereby the gas pressure, in the gas-filled volume of reaction chamber 16. Accordingly, turbomolecular pump 52 and roughing pump 54 cooperate to evacuate processing chamber 16 so as to impart a vacuum, or sub-atmospheric pressure, within the chamber. Roughing pump 54 operates to produce a low-to-medium vacuum. Turbomolecular pump 52, arranged serially with roughing pump 54, is a high-vacuum pump which operates to produce higher vacuum levels, supplementing the roughing pump. Turbomolecular pump 52 comprises a turbomolecular high-vacuum pump, preferably in the form of a compression-type pump which functions similar to a diffusion pump. A turbomolecular pump causes momentum transfer to occur through impacts of gas molecules with high-speed rotating blades. In order to ensure proper operation, a backing pump is utilized in order to keep a forepressure low enough to sustain molecular flow everywhere in the turbomolecular pump 52. Accordingly, roughing pump 54 serves as such a backing pump. During operation, products and gases removed by pumps 52 and 54 are withdrawn through an outlet 56 where they are collected and processed for disposal, storage and/or recycling.

A similar turbomolecular pump 53 and roughing pump 55 cooperate to reduce the gas density, and thereby the gas pressure, in the gas-filled volume of transfer chamber 50. Turbomolecular pump 53 and roughing pump 55 cooperate to evacuate transfer chamber 50 following loading and unloading of wafers from transfer chamber 50. Transfer chamber isolation valve 43 is closed during such loading and unloading, isolating transfer chamber 50 from processing chamber 16. Subsequently, turbomolecular pump 53 and roughing pump 55 cooperate to evacuate transfer chamber 50 to a pressure similar to that found within processing chamber 16. Subsequently, valve 43 is opened, bringing transfer chamber 50 and processing chamber 16 into equilibrium at a similar sub-atmospheric pressure. During operation, products and gases removed by pumps 53 and 55 are withdrawn through an outlet 57 where they are collected and processed for disposal, storage, and/or recycling.

As shown in FIG. 1, particle traps 42, 44a, 44b, 45, 46, 47, and 49 each comprise an electrostatic precipitator associated with at least one of the processing chamber 16, gas inlet lines 36 and 38, gas outlet line 40, turbomolecular pump 52, and transfer chamber 50. Although particle trap 42 is shown associated with gas inlet line 38 within processing chamber 16, it is understood that particle trap 42 can be associated with gas inlet line 38 externally of the processing chamber according to the construction described below with reference to FIG. 4.

Figure 2:
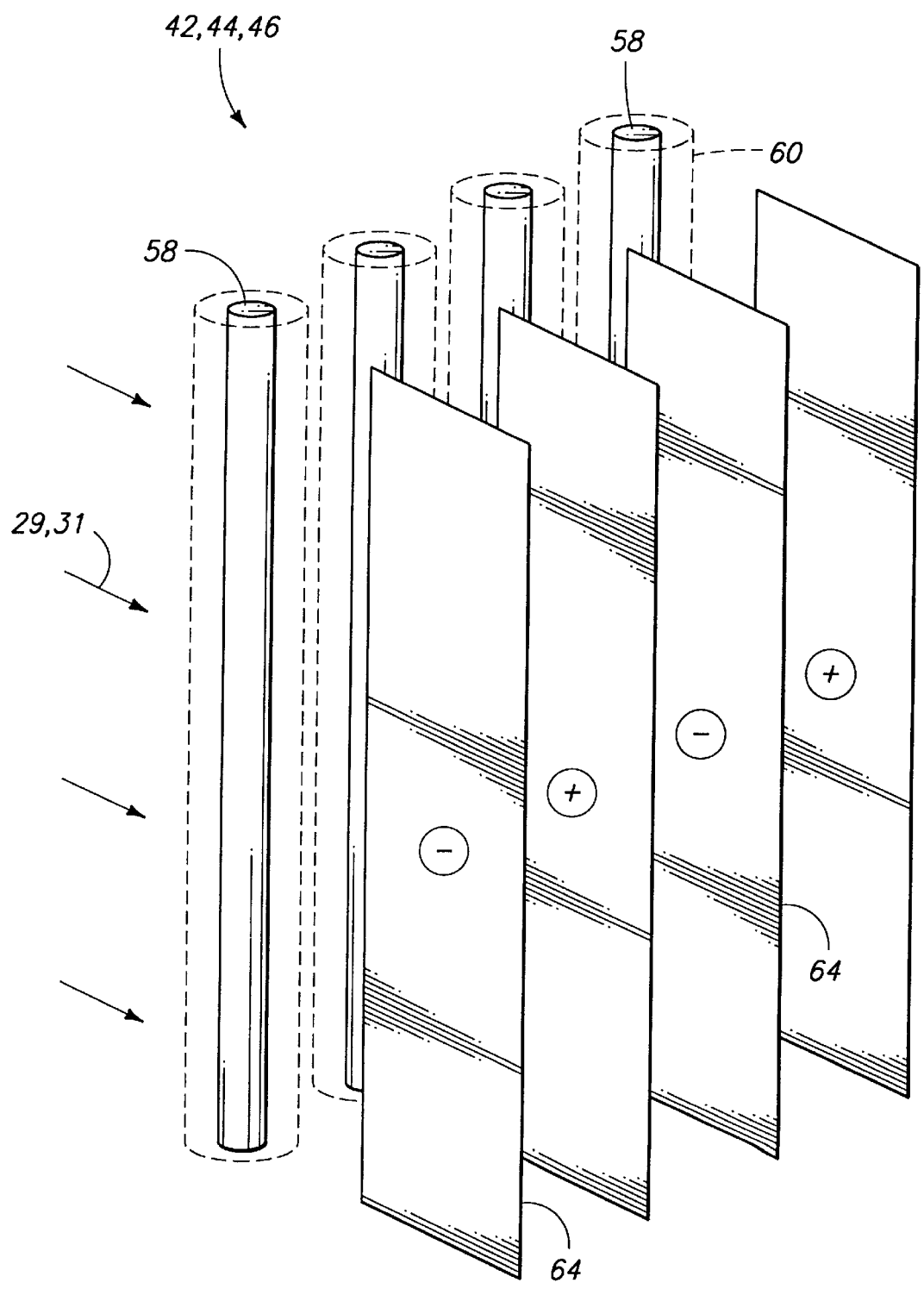
FIG. 2 shows one implementation of one preferred particle trap for use in the FIG. 1 system.

Referring to FIG. 2, exemplary alternate particle traps 42, 44, 45, 46, 47, and 49 are each formed from an array of chargeable wires 58 and an array of charged collector plates 64 provided in one of fluid flow paths 29 or 31. Wires 58 and plates 64 each comprise a chargeable element that would be suspended in electrically insulated relation from the interior surface of the processing chamber. One of the chargeable elements comprises an array of electrified wire 58 configured to generate an electric field and operative to charge particles present within the processing chamber. The other chargeable element comprises charged plate 64 electrically isolated from the array of wires and positioned downstream of the array of wires for precipitating particles from the gas. In one embodiment, wires 58 are electrified to generate an electric field 60 so as to form an ionizer for charging particles passing therealong.

Wires 58, according to one implementation, are arranged in a substantially parallel configuration and are carried by a wall of the processing chamber in electrically insulated relation. Likewise, the array of plates 64 are suspended in a substantially parallel configuration, downstream of wires 58, where they are also suspended from a wall of the processing chamber in electrically insulated relation. Accordingly, wires 58 and plates 64 are positioned within a processing chamber to form an electrostatic precipitator that is associated internally within the processing chamber.

Wires 58, electrically charged to form electric field 60, form a charge-imparting structure comprising an ionogenic wire. In another form, wires 58 can be woven into a charged structural component comprising a chargeable screen. The chargeable screen can further comprise a metal screen. Accordingly, an array of wires 58 positioned upstream of an array of charged collector plates 64 cooperate to form a particle trap comprising a first chargeable component positioned in fluid communication with a fluid flow path 29 and/or 31 within the processing chamber, and a second chargeable component positioned downstream of the first chargeable component. In yet another version, the electrostatic precipitator comprises a charge-imparting structure for imparting a charge to particles associated with the processing chamber and at least two adjacent collector structures having opposite charges to one another for collecting charged particles. Accordingly, wires 58 impart a first charge and at least some of collector plates 64 impart an opposite, second charge. For the case where wires 58 comprise an ionizer, the ionizer comprises a chargeable element interposed within a gas fluid flow path 29 and/or 31 within the processing chamber.

Further according to FIG. 2, wires 58 comprise an electrostatic charge inducer operative to impart a first charge to particles in fluid communication within a fluid flow path, such as paths 29 and/or 31, of a reaction chamber 16 (see FIG. 1). Charged collector plates 64 comprise chargeable particulate filter plates further comprising a plurality of electrified collector plates charged to attract and collect any charged particles present within the reaction chamber. As shown in FIG. 2, in one construction the plurality of electrified collector plates 64 are associated in substantially parallel and adjacent relation with adjacent plates receiving opposite charges.

Figure 3:
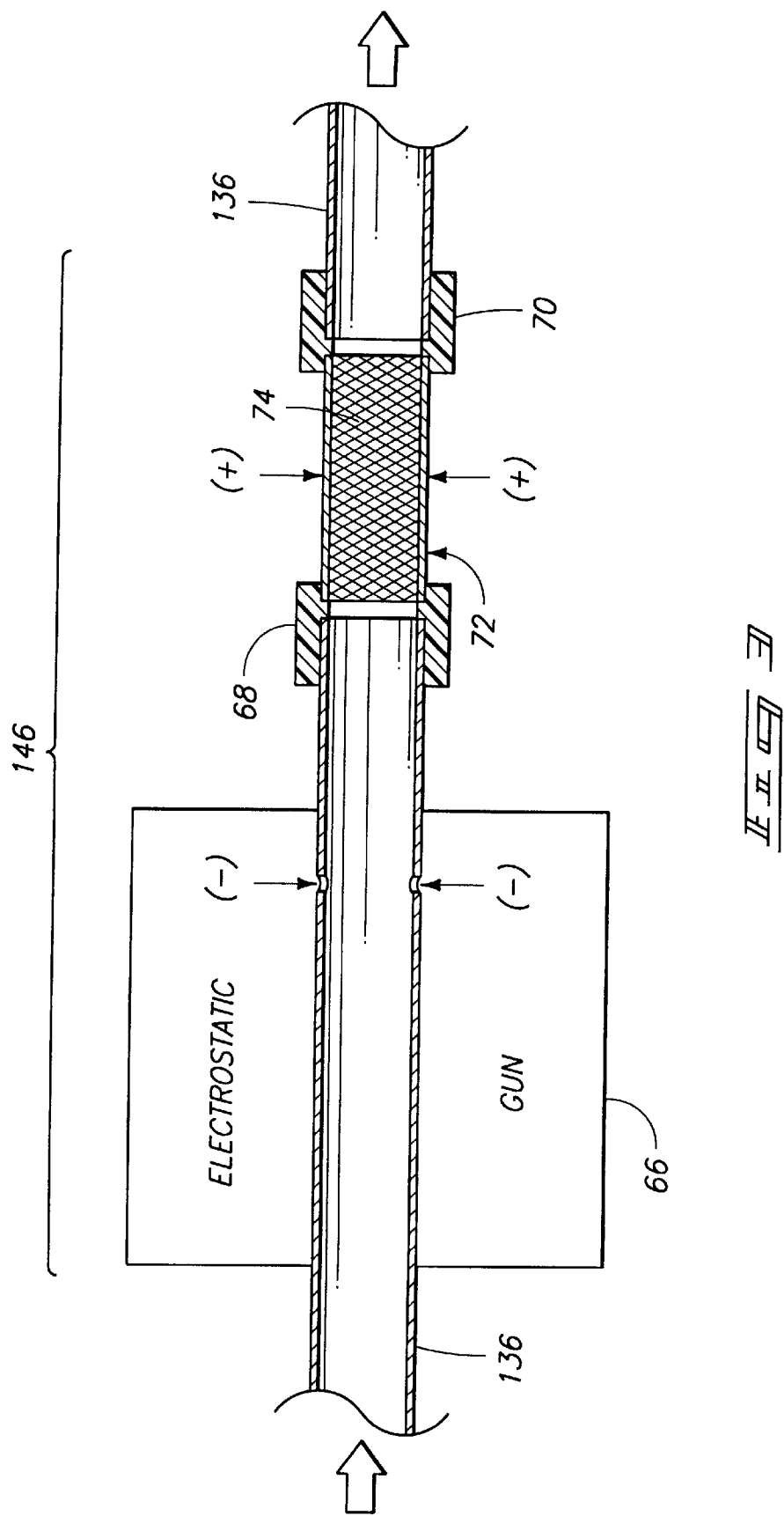
FIG. 3 shows another implementation of another preferred particle trap for use in the FIG. 1 system.

Referring to FIG. 3, a particle trap 146 is provided in the form of an electrostatic precipitator suitable for use in a gas line 136 such as a gas inlet line, a gas outlet line, or within the interior of a processing chamber and in association with a gas inlet line or a gas outlet line extending therein. More particularly, the electrostatic precipitator comprises a gas line electrostatic filter provided in fluid communication with the associated gas line 136, in the form of an inlet line or an outlet line. Particle trap 146 includes an electrostatic charge-imparting structure in the form of an electrostatic gun 66 provided along an upstream portion of gas line 136. Particle trap 146 further comprises an oppositely charged structure 72 in the form of a collector structure provided downstream of the charge-imparting structure, or electrostatic gun 66. When gas line 136 comprises a gas inlet line, particle filter 146 comprises an electrostatic precipitator provided in the gas inlet line. Electrostatic gun 66 comprises an electrostatic charge inducer which charges particles found within gas passing through gas line 136. The charged particles are then attracted to an oppositely-charged array of electrifiable wire supported in electrical isolation by gas line 136.

Charged structure 72 of FIG. 3 is supported in electrically isolated relation by gas line 136 via a pair of insulative separators for supporting the selectively chargeable, electrically conductive filter of screen 74 in electrically insulated relation with gas line 136.

Screen 74 can be formed from a chargeable metal screen material, an array of expanded metal strands, a woven wire material, or a random fiber-oriented electrifiable strand material. For the case where gas line 136 is a gas inlet line, insulative separators 68 and 70 are provided between the electrostatic precipitator of charged structure 72 and the associated gas line 136. Similarly, where gas line 136 is a gas outlet line, insulative separators 68 and 70 are provided between the electrostatic precipitator of charged structure 72 and gas line 136. Accordingly, the insulative separators 68 and 70 are operative to support the electrostatic precipitator of charged structure 72 in electrically isolated, fluid flow communication with gas outlet line 136.

It is to be understood that insulative separators 68 and 70 can comprise insulative ceramic separators, or separators formed from any other insulative material. Additionally, or alternatively, insulative separators 68 and 70 can be formed from a single, common piece of material. Even further, insulative separators 68 and 70 can be provided for supporting electrostatic gun 66 in electrically insulated relation with gas line 136.

Figure 4:
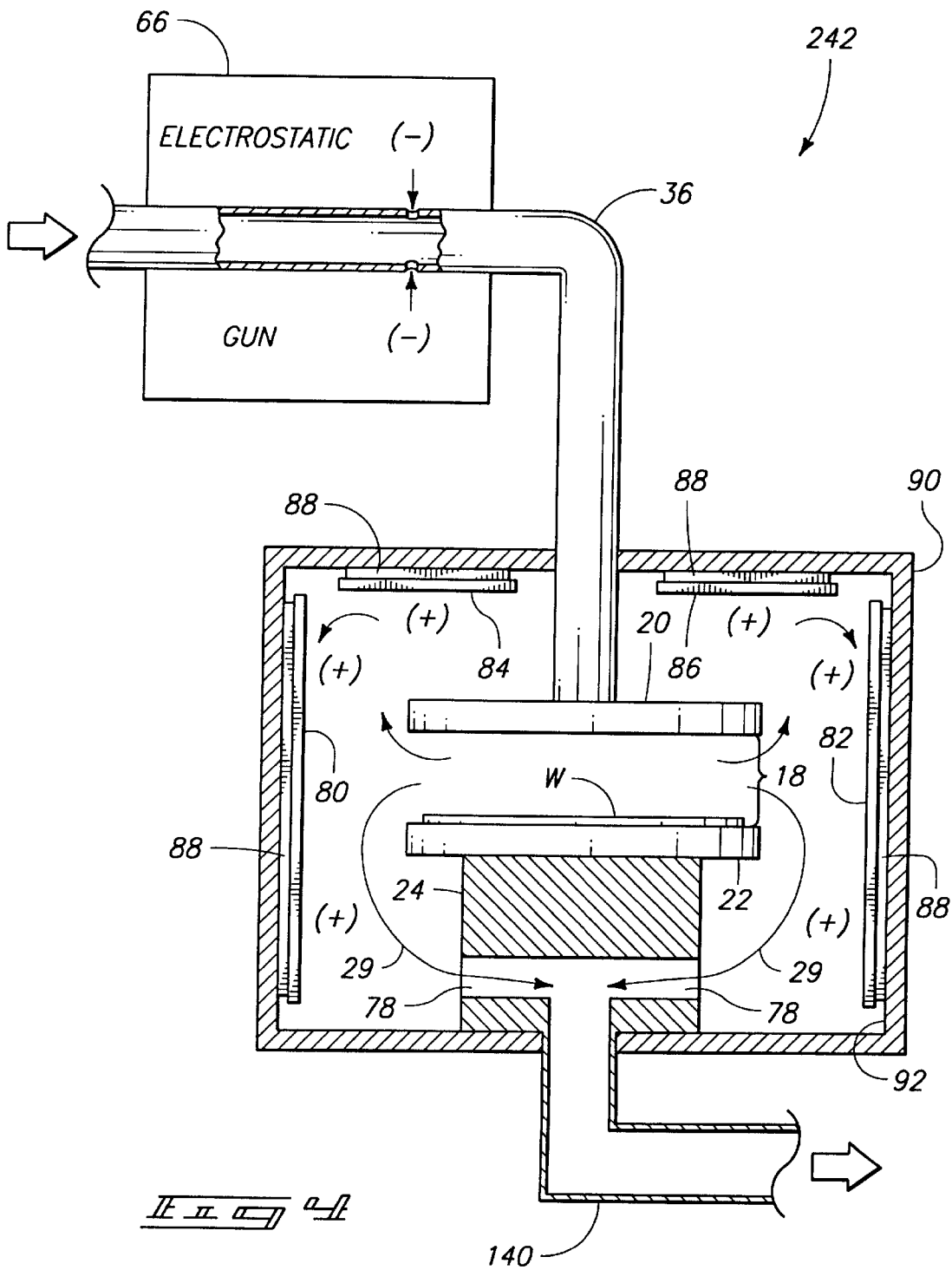
FIG. 4 shows another implementation of another preferred particle trap for use in a precursor chamber.

Referring to FIG. 4, another implementation of a particle trap 242 is disclosed for use in a precursor chamber 90. Particle trap 242 comprises an electrostatic gun 66 provided along an upstream portion of a gas inlet line 36. Particle trap 242 further comprises a plurality of collector plates in the form of electrically chargeable scrubber plates 80, 82, 84 and 86 provided along one or more inner walls comprising interior surface 92 of chamber 90. Each of scrubber plates 80–86 is supported in electrically insulated relation with the wall of interior surface 92 by way of an electrically insulating layer of material 88. Gas is emitted from gas emitter 20 where it travels through precursor chamber 90, exiting at outlet vent 78, where it is withdrawn via gas outlet line 140. Accordingly, electrostatic gun 66 comprises an electrostatic charge inducer operatively associated with gas line 36 to impart a charge to particulate flowing within gas line 36. Scrubber plates 80, 82, 84 and 86, individually and collectively, comprise selectively chargeable, electrically conductive filters associated with gas line 36. The chargeable filters are electrically isolated from gas line 36 and are capable of being effectively charged to capture charged particulate in the gas line by the electrostatic charge inducer. As such, particle trap 242 is configured in the form of a semiconductor processor gas filtering system. Alternatively, a semiconductor processor gas filtering system can be provided in line within a gas line 136 or 40 such as disclosed in reference to FIGS. 3 and 5.

Figure 5:
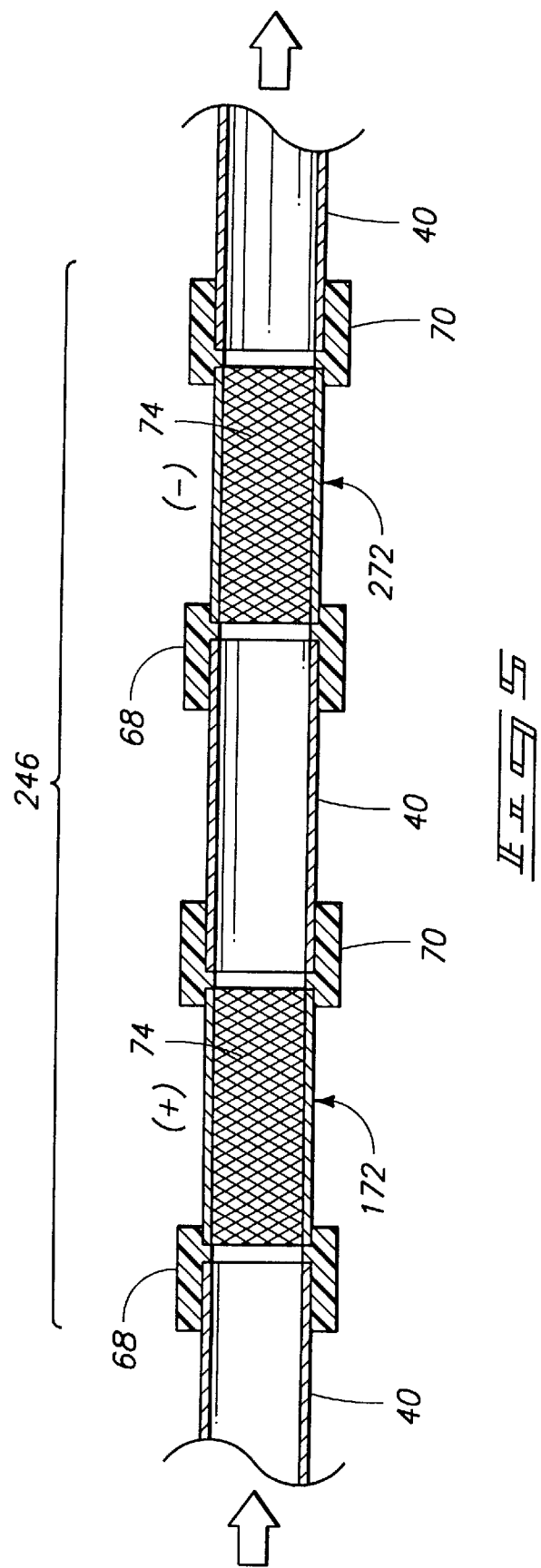
FIG. 5 shows another implementation of another preferred particle trap for use in the FIG. 1 system.

Referring to FIG. 5, another embodiment of the present invention is described in the form of another particle trap 246 configured for use in line within a gas line in the form of a gas outlet line 40. Particle trap 246 comprises a first charged structure 172 provided along an upstream portion of outlet line 40 and a second charged structure 272 provided downstream of charged structure 172. Each of charged structures 172 and 272 are supported in electrically insulated relation with gas outlet line 40 by way of a pair of insulative separators 68 and 70. Charged structures 172 and 272 are further separated by a section of outlet line 40 in this implementation.

Charged structures 172 and 272 cooperate such that charged structure 172 imparts a positive charge to particles contained within gases flowing within outlet line 40, and charged structure 272 imparts a second, opposite charge to the charged particles, attracting and collecting them along the charged structure 272. In this manner, charged structures 172 and 272 cooperate to provide a charge-imparting structure and an electrostatic precipitator, respectively, provided within a fluid flow path of gas outlet line 40. Each of charged structures 172 and 272 comprise a selectively chargeable, electrically conductive filter. Charged structure 272 comprises a collector formed from an array of electrifiable wire in the form of a screen 74 supported in electrical isolation by gas line 40 downstream of the electrostatic charge inducer provided by charged structure 172. Charged structure 172 also comprises an array of electrifiable wires supported in electrically isolated relation by gas line 40. Accordingly, particle trap 246 provides a semiconductor processor gas filtering system suitable for use within a gas outlet line 40. Even further, insulative separators 68 and 70 serve to support an electrostatic charge inducer in the form of charged structure 172 in electrically insulated relation with gas line 40. Even further, article trap 246 forms an electrostatic precipitator that is proximate the gas outlet line 40.

The embodiments depicted in FIGS. 1–5 further disclose apparatus for implementing methods of this invention for performing semiconductor wafer processing. Utilizing the apparatus disclosed in FIG. 1, a semiconductor wafer can be positioned within a processing chamber. With the wafer positioned within a processing chamber, electrostatic filtering can be performed on at least one of gas flowing to the chamber, gas flowing within the chamber, or gas flowing from the chamber of the semiconductor wafer processor. With reference to FIG. 1, semiconductor wafer processor 10 implements electrostatic filtering via filters 42, 44a, 44b, 46, and 47 within processing chamber 16. Filters 45 and 49 are implemented in association with processing chamber 16. With respect to the implementation of FIGS. 3 and 5, electrostatic filtering is conducted on gas flowing either to or from a processing chamber.

According to the construction of FIG. 2 as implemented in the device of FIG. 1, electrostatic filtering can include ionizing particles within the gas of fluid flow paths 29 or 31 and precipitating the ionized particles on an oppositely charged element 64 presented in fluid communication with the gas of fluid flow paths 29 or 31. A further method of processing semiconductor wafers by electrostatically filtering them from one or more of gas flowing to a processing chamber, gas flowing within a processing chamber, or gas flowing from a processing chamber, involves removing the particles after they have been electrostatically collected on a charged surface. For example, charged plates 64 of FIG. 2 will collect particles thereon. After collecting the particles via electrostatic filtering, collector plates 64 can be heated while charge is removed from the collector plates to outgas the retained particles and remove them from a processing chamber, such as processing chamber 16 of FIG. 1. The outgassed particles can then be withdrawn from processing chamber 16 via partial or nearly total evacuation of the processing chamber 16 by way of turbomolecular pump 52, roughing pump 54, and outlet 56.

One way of heating collector plates 64 of FIG. 2 includes applying current to collector plates 64 to raise their temperature via internal resistance. In one implementation, a vacuum is applied to the processing chamber while collector plates 64 are heated. Even further according to the implementation of FIG. 2, the step of electrostatically filtering includes the step of imparting a first charge to particles by way of wires 58 within a processing chamber, and electrically charging the collector plates 64 with a second, opposite charge such that the collector plates 64 attract the charged particles within the processing chamber. In yet another variation, subsequent to attracting the charged particles to collector plate 64, the charge on collector plate 64 can be reversed during the step of heating in order to repel the charged particles, subsequently removing them from the processing chamber by applying a vacuum.

Even another method of filtering particles from within a semiconductor wafer processor is envisioned by implementing the apparatus 1–5 of this invention. More particularly, processing gases can be caused to flow through a processing chamber, such as chamber 16 of FIG. 1, of a semiconductor wafer processor 10. Particles can be filtered from within a processing reactor of the processing chamber 16. By implementing particle trap 42, particles can be removed upstream of wafer deposition zone 18 of the processing reactor. By implementing any one or more of particle traps 44a, 44b, 45, or 46, particles can be removed downstream of wafer deposition zone 18 of the processing reactor. It is envisioned that the step of filtering includes the step of electrostatically precipitating the particles from within the processing reactor by way of any one of particle traps 42, 44a, 44b, 45, or 46. It is also envisioned that particles can be removed from turbomolecular pump 52 and transfer chamber 50, when associated valves 41 and 43, respectively, are closed or open. It is further envisioned that the step of filtering particles from within a processing reactor or processing chamber 16 is intended to be effected by controllably operating an electrostatic filter for receiving and removing particles from the processing reactor.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A semiconductor wafer vapor processor, comprising:
   a processing chamber for containing a gas during processing of a semiconductor wafer and in which a chemical reaction is conducted; and
   a particle trap positioned within the processing chamber and operative for removing particles from the gas within the processing chamber.

2. The semiconductor wafer vapor processor of claim 1 wherein the particle trap comprises a chargeable component provided in a fluid flow path within the processing chamber, the chargeable component operable to attract undesired particles from within the processing chamber.

3. The semiconductor wafer vapor processor of claim 1 wherein the gas forms a fluid flow path through the processing chamber, and the particle trap is place in a downstream portion of the processing chamber.

4. The semiconductor wafer vapor processor of claim 1 wherein the particle trap comprises a first chargeable component positioned in fluid communication with a fluid flow path within the processing chamber and a second chargeable component positioned downstream of the first chargeable component.

5. The semiconductor wafer vapor processor of claim 4 wherein the first chargeable component comprises a metal screen.

6. The semiconductor wafer vapor processor of claim 4 wherein the second chargeable component comprises a collector plate.

7. The semiconductor wafer vapor processor of claim 1 further comprising a wafer deposition zone and a gas outlet line, the particle trap associated in greater proximity with the gas outlet line than with the wafer deposition zone.

8. A semiconductor wafer vapor deposition reactor, comprising:
   a reaction chamber for containing a gas during processing of a semiconductor wafer and in which a chemical reaction is conducted; and
   a filter positioned within the reaction chamber and operative for removing particles from within the reaction chamber.

9. The semiconductor wafer vapor deposition reactor of claim 8 wherein the filter comprises a chargeable component provided in a fluid flow path within the reaction chamber, the chargeable component operable to attract undesired particles from within the reaction chamber.

10. The semiconductor wafer vapor deposition reactor of claim 9 wherein the charged structural component comprises a chargeable screen.

11. The semiconductor wafer vapor deposition reactor of claim 8 wherein the gas forms a fluid flow path through the reaction chamber, and the filter comprises a particle trap placed in the reaction chamber in a downstream portion of the fluid flow path relative to the semiconductor wafer.

12. The semiconductor wafer vapor deposition reactor of claim 8 wherein the charge imparting structure comprises an ionogenic wire.

13. The semiconductor wafer vapor deposition reactor of claim 8 further comprising a gas outlet line in fluid communication with the reaction chamber, and wherein the filter is proximate the gas outlet line.

14. A semiconductor wafer vapor processor comprising:
a processing chamber in which a chemical reaction is conducted;
a gas inlet line extending to the processing chamber and a gas outlet line extending from the processing chamber; and
an electrostatic precipitator associated with at least one of the processing chamber, the gas inlet line or the gas outlet line.

15. The semiconductor wafer vapor processor of claim 14 wherein the electrostatic precipitator is associated internally within the processing chamber.

16. The semiconductor wafer vapor processor of claim 14 wherein the electrostatic precipitator is associated with the gas inlet line external of the processing chamber.

17. The semiconductor wafer vapor processor of claim 14 wherein the electrostatic precipitator is associated with the gas outlet line external of the processing chamber.

18. The semiconductor wafer vapor processor of claim 14 wherein the electrostatic precipitator is proximate the gas inlet line within the processing chamber.

19. The semiconductor wafer vapor processor of claim 14 wherein a fluid flow path is provided within the processing chamber, extending between the gas inlet line and the gas outlet line, the electrostatic precipitator provided within the fluid flow path.

20. The semiconductor wafer vapor processor of claim 19 further comprising a wafer deposition zone within the processing chamber, the electrostatic precipitator provided downstream of the wafer deposition zone.

21. The semiconductor wafer vapor processor of claim 14 wherein the electrostatic precipitator comprises a gas line electrostatic filter provided in fluid communication with one of the gas inlet line and the gas outlet line.

22. The semiconductor wafer vapor processor of claim 21 further comprising an insulative separator provided between the electrostatic precipitator and one of the associated gas inlet line and gas outlet line.

23. The semiconductor wafer vapor processor of claim 21 wherein the electrostatic filter comprises an electrostatic charge imparting structure provided along an upstream portion of the gas line, and an oppositely charged collector structure provided downstream of the charge imparting structure.

24. The semiconductor wafer vapor processor of claim 23 wherein the electrostatic charge imparting structure comprises an electrostatic gun.

25. The semiconductor wafer vapor processor of claim 14 further comprising an insulative separator operative to support the electrostatic precipitator in electrically isolated, fluid flow communication with the gas outlet line.

26. The semiconductor wafer vapor processor of claim 14 wherein the electrostatic precipitator comprises a charge imparting structure for imparting a charge to particles associated with the processing chamber and at least two adjacent collector structures having opposite charges to one another for collecting charged particles.

27. A semiconductor wafer vapor processor comprising:
a processing chamber in which a chemical reaction is conducted;
a wafer holder within the processing chamber; and
a particle filter comprising at least two chargeable elements positioned within the processing chamber and spaced from the wafer holder.

28. The semiconductor wafer vapor processor of claim 27 wherein one of the chargeable elements comprises an ionizer interposed within a gas fluid flow path within the processing chamber.

29. The semiconductor wafer vapor processor of claim 28 wherein the other of the chargeable elements comprises a charge plate electrically isolated from the ionizer and positioned downstream of the ionizer for precipitating particles from the gas.

30. The semiconductor wafer vapor processor of claim 27 wherein one of the chargeable elements comprises a charge plate supported in spaced and electrically isolated relation from a wall of the reaction chamber.

31. The semiconductor wafer vapor processor of claim 27 further comprising a wafer deposition zone provided in the processing chamber, and wherein the at least two chargeable elements are provided in closer proximity with the gas outlet line than with the wafer deposition zone.

32. The semiconductor wafer vapor processor of claim 27 further comprising a wafer deposition zone provided in the processing chamber, a gas fluid flow path provided in the processing chamber, and wherein the particle filter is provided downstream of the wafer deposition zone.

33. The semiconductor wafer vapor processor of claim 27 wherein one of the chargeable elements comprises an array of electrifiable wire configured to generate an electric field and operative to charge particles present within the processing chamber.

34. A semiconductor wafer vapor deposition reactor comprising:
a reaction chamber in which a chemical reaction is conducted;
a wafer holder within the reaction chamber;
a gas emitter within the reaction chamber proximate the wafer holder, the gas emitter and wafer holder defining a deposition zone therebetween; and
a particle filter within the reaction chamber external of the deposition zone.

35. The semiconductor wafer vapor deposition reactor of claim 34 further comprising a gas outlet line extending from the processing chamber, wherein the particle filter is spaced from the wafer holder proximate the gas outlet line.

36. The semiconductor wafer vapor deposition reactor of claim 34 wherein the particle filter comprises an electrostatic precipitator.

37. The semiconductor wafer vapor deposition reactor of claim 36 wherein the electrostatic precipitator comprises an ionizer supported for fluid communication with any gas contained within the reaction chamber and configured to charge particles present within the gas.

38. The semiconductor wafer vapor deposition reactor of claim 37 wherein the ionizer comprises an electrified wire configured to generate an electric field for charging particles present within the gas.

39. The semiconductor wafer vapor deposition reactor of claim 34 further comprising a gas inlet line provided in fluid communication with the chamber and operative to supply processing gas to the processing chamber.

40. The semiconductor wafer vapor deposition reactor of claim 39 wherein the filter comprises an electrostatic precipitator provided in the gas inlet line.

41. The semiconductor wafer vapor deposition reactor of claim 40 wherein the gas inlet line further comprises an insulative separator for supporting the electrostatic precipitator in electrically insulated relation along a gas fluid flow path of the gas inlet line.

42. A semiconductor wafer vapor deposition reactor comprising:
   a reaction chamber having internal walls within which a chemical reaction is conducted;
   a wafer holder within the reaction chamber; and
   at least one selectively chargeable particulate filter plate received within the reaction chamber, the plate being mounted to at least one of the internal chamber walls through an insulator which electrically isolates the plate from the walls.

43. The semiconductor wafer vapor deposition reactor of claim 42 further comprising an electrostatic charge inducer operative to impart a first charge to particles in fluid communication with the reaction chamber, the chargeable particulate filter plate imparted with a second, opposite charge to attract and collect any charged particles present within the reaction chamber.

44. The semiconductor wafer vapor deposition reactor of claim 43 wherein the electrostatic charge inducer comprises an electrostatic gun.

45. The semiconductor wafer vapor deposition reactor of claim 42 further comprising an electrostatic charge inducer operative to impart a first charge to particles in fluid communication with the reaction chamber, the chargeable particulate filter plate further comprising a plurality of electrified collector plates charged to attract and collect any charged particles present within the reaction chamber.

46. The semiconductor wafer vapor deposition reactor of claim 45 wherein the plurality of electrified collector plates are associated in substantially parallel and adjacent relation with adjacent plates receiving opposite charges.

47. The semiconductor wafer vapor deposition reactor of claim 42 further comprising a wafer deposition zone, the selectively chargeable particulate filter plate received within the reaction chamber outside of the wafer deposition zone.

48. A semiconductor processor gas filtering system comprising:
   a gas line;
   an electrostatic charge inducer operatively associated with the gas line to impart a charge to particulate flowing within the gas line; and
   a selectively chargeable electrically conductive filter associated with the gas line, the chargeable filter being electrically isolated from the gas line and capable of being effectively charged to capture particulate charged within the gas line by the electrostatic charge inducer.

49. The semiconductor processor gas filtering system of claim 48 wherein the electrostatic charge inducer comprises an electrostatic gun.

50. The semiconductor processor gas filtering system of claim 48 wherein the electrostatic charge inducer comprises an array of electrifiable wire supported in electrical isolation by the gas line.

51. The semiconductor processor gas filtering system of claim 48 wherein the selectively chargeable electrically conductive filter comprises a collector formed from an array of electrifiable wire supported in electrical isolation by the gas line downstream of the electrostatic charge inducer.

52. The semiconductor processor gas filtering system of claim 48 further comprising an insulative separator for supporting one or more of the electrostatic charge inducer and the selectively chargeable electrically conductive filter in electrically insulated relation with the gas line.

53. A semiconductor wafer vapor processor comprising:
   a processing chamber having at least one internal wall within which a chemical reaction is conducted;
   a gas inlet line extending to the processing chamber and a gas outlet line extending from the processing chamber;
   a wafer holder within the processing chamber;
   a gas emitter within the processing chamber proximate the wafer holder, the gas emitter and wafer holder defining a deposition zone therebetween;
   a fluid flow path extending from the gas inlet line to the gas outlet line;
   a first electrostatic precipitator received within the processing chamber and supported by the internal wall upstream of the deposition zone;
   a second electrostatic precipitator received within the processing chamber and supported by the internal wall downstream of the deposition zone;
   a third electrostatic precipitator received within the processing chamber and supported by the internal wall downstream of the deposition zone and spaced from the second electrostatic precipitator; and
   a fourth electrostatic precipitator received within the processing chamber and supported proximate the gas outlet line.

54. The semiconductor wafer vapor processor of claim 53 further comprising a turbomolecular pump associated with the gas outlet line, and a roughing pump further associated with the turbomolecular pump, the turbomolecular pump and the roughing pump cooperating in series to impart a vacuum pressure within the processing chamber during a processing operation.

55. The semiconductor wafer vapor processor of claim 53 wherein at least one of the electrostatic precipitators comprises at least two chargeable elements supported in adjacent, spaced apart relation within the processing chamber.

56. The semiconductor vapor processor of claim 55 a first chargeable element imparts a first charge to charge particulate within the processing chamber, and a second chargeable element imparts a second, opposite charge to attract and collect the charged particulate.

57. A semiconductor wafer processing method comprising:
   positioning a semiconductor wafer within a processing chamber; and
   with the wafer positioned therein, electrostatically filtering at least one of gas flowing to the chamber, gas flowing within the chamber, or gas flowing from the chamber.

58. A method in accordance with claim 57 comprising electrostatically filtering gas flowing to the chamber.

59. A method in accordance with claim 57 comprising electrostatically filtering gas flowing within the chamber.

60. A method in accordance with claim 57 comprising electrostatically filtering gas flowing from the chamber.

61. A method in accordance with claim 57 wherein the step of electrostatically filtering comprises ionizing particles within the gas and precipitating the ionized particles on an oppositely charged element presented in fluid communication with the gas.

62. A semiconductor wafer processing method comprising:
   positioning a semiconductor wafer within a processing chamber;
   with the wafer positioned therein, electrostatically filtering at least one of gas flowing to the chamber, gas flowing within the chamber, or gas flowing from the chamber to retain particles on a collector;

following the step of electrostatically filtering, removing electrostatic charge from the collector and heating the collector to outgas the retained particles; and withdrawing the outgassed retained particles from the processing chamber.

63. A method in accordance with claim 62 wherein the step of heating the collector includes applying current to the collector.

64. A method in accordance with claim 62 which includes, during heating the collector, applying a vacuum to the processing chamber.

65. A method in accordance with claim 62 wherein the step of electrostatically filtering includes the steps of imparting a first charge to particles within the processing chamber and electrically charging the collector with a second, opposite charge such that the collector attracts the first charged particles within the processing chamber.

66. A method in accordance with claim 62 wherein following the step of electrostatically filtering, further comprising the step of reversing the charge on the collector during the step of heating to repel the charged particles.

67. A method of filtering particles in a semiconductor wafer processor, comprising:

causing process gas to flow through a processing chamber of a semiconductor wafer processor; and filtering particles from within a processing reactor of the processing chamber at a location removed from a fluid flow path along which the process gas is delivered.

68. A method in accordance with claim 67 which includes causing the particles to be removed upstream of a deposition zone of the processing reactor.

69. A method in accordance with claim 67 which includes causing the particle to be removed downstream of a deposition zone of the processing reactor.

70. A method in accordance with claim 67 wherein the step of filtering includes the step of electrostatically precipitating the particles from within the processing reactor.

71. A method in accordance with claim 67 wherein the step of filtering particles from within a processing reactor of the processing chamber is effected by controllably operating an electrostatic filter for receiving and removing particles from the processing reactor.

72. A semiconductor wafer vapor processor, comprising:

a processing chamber configured to contain a process gas during processing of a semiconductor wafer;

a process gas inlet line entering the processing chamber and configured to deliver process gas into the processing chamber;

a gas outlet line exiting the processing chamber and configured to exhaust the gas from the processing chamber;

a wafer deposition zone interposed between the gas inlet line and the gas outlet line, a fluid flow path extending from the process gas inlet line to the wafer deposition zone along which process gas is delivered; and an active electrostatic precipitator disposed within the processing chamber, removed from the wafer deposition zone, and at a location removed from the fluid flow path so as to provide substantially uninterrupted flow of process gas along the fluid flow path to a wafer present in the wafer deposition zone, the active electrostatic precipitator further operative to remove particles entrained within the gas contained within the processing chamber.

73. The semiconductor wafer vapor processor of claim 72 wherein the active electrostatic precipitator comprises an active electrostatic filter positioned in fluid communication with the gas present within the processing chamber, the active electrostatic precipitator operative to accumulate reaction particles created within the processing chamber during a reaction process.

74. The semiconductor wafer vapor processor of claim 72 wherein the process gas comprises a reaction gas, and wherein the active electrostatic precipitator is carried proximate the fluid flow path so as to attract entrained particles therefrom while the process gas maintains substantially unimpeded flow.

75. The semiconductor wafer vapor processor of claim 72 wherein the active electrostatic precipitator is supported in association with the process gas and is otherwise free of the process gas flow path.

\* \* \* \* \*

UNITED STATES PATENT AND TRADEMARK OFFICE
CERTIFICATE OF CORRECTION

PATENT NO. : 6,206,970 B1
DATED : March 27, 2001
INVENTOR(S) : David R. Atwell

Page 1 of 1

It is certified that error appears in the above-identified patent and that said Letters Patent is hereby corrected as shown below:

Column 8,
Line 55, delete "Even further, article", and insert -- Even further, particle --.

Column 10, claim 3,
Line 24, delete "trap is place", and insert -- trap is placed --.

Column 14, claim 56,
Line 35, after "of claim 55" insert -- wherein --.

Signed and Sealed this

Sixteenth Day of October, 2001

Attest:

*Nicholas P. Godici*

NICHOLAS P. GODICI
*Attesting Officer*  *Acting Director of the United States Patent and Trademark Office*